United States Patent
Sandhu et al.

(10) Patent No.: US 9,373,775 B2
(45) Date of Patent: Jun. 21, 2016

(54) METHODS OF FORMING MAGNETIC MEMORY CELLS

(75) Inventors: Gurtej S. Sandhu, Boise, ID (US);
Witold Kula, Sunnyvale, CA (US);
Wayne I. Kinney, Emmett, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/614,212

(22) Filed: Sep. 13, 2012

(65) Prior Publication Data

US 2014/0070342 A1 Mar. 13, 2014

(51) Int. Cl.
*H01L 27/20* (2006.01)
*H01L 43/08* (2006.01)
*H01L 43/12* (2006.01)
*H01L 27/22* (2006.01)

(52) U.S. Cl.
CPC ............. *H01L 43/08* (2013.01); *H01L 27/222* (2013.01); *H01L 43/12* (2013.01); *H01L 27/224* (2013.01); *H01L 27/226* (2013.01)

(58) Field of Classification Search
CPC ... H01L 27/222; H01L 27/224; H01L 27/226; H01L 27/22; H01L 21/0334; H01L 21/3083; H01L 21/3065; H01L 21/32; H01L 21/32139; H01L 21/467; H01L 2224/03612; H01L 2224/1162; H01L 2224/03552; H01L 2224/0363; H01L 2224/03632
USPC ......... 257/421, E29.323, E43.006; 438/3, 39, 438/40, 22
See application file for complete search history.

(56) References Cited

U.S. PATENT DOCUMENTS

| | | | |
|---|---|---|---|
| 5,650,958 A | 7/1997 | Gallagher et al. | |
| 6,560,135 B2* | 5/2003 | Matsuoka et al. | 365/97 |
| 6,703,249 B2 | 3/2004 | Okazawa et al. | |
| 7,863,060 B2 | 1/2011 | Belen et al. | |

(Continued)

FOREIGN PATENT DOCUMENTS

| | | |
|---|---|---|
| JP | 2000195251 A | 7/2000 |
| JP | 2002-314049 A | 10/2002 |

(Continued)

OTHER PUBLICATIONS

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), Jun. 14-16, 2011, 19 pages.

(Continued)

*Primary Examiner* — Victoria K Hall
(74) *Attorney, Agent, or Firm* — TraskBritt

(57) ABSTRACT

Methods of forming memory cells, magnetic memory cell structures, and arrays of magnetic memory cell structures are disclosed. Embodiments of the methods include patterning a precursor structure to form a stepped structure including at least an upper discrete feature section and a lower feature section with a broader width, length, or both than the upper discrete feature section. The method uses patterning acts directed along a first axis, e.g., an x-axis, and then along a second axis, e.g., a y-axis, that is perpendicular to or about perpendicular to the first axis. The patterning acts may therefore allow for more uniformity between a plurality of formed, neighboring cell core structures, even at dimensions below about thirty nanometers. Magnetic memory structures and memory cell arrays are also disclosed.

15 Claims, 13 Drawing Sheets

(56) References Cited

U.S. PATENT DOCUMENTS

| | | | |
|---|---|---|---|
| 7,919,794 B2 | 4/2011 | Gu et al. | |
| 8,009,465 B2 * | 8/2011 | Nakayama et al. | 365/158 |
| 2002/0160541 A1 | 10/2002 | Durcan et al. | |
| 2004/0091744 A1 | 5/2004 | Carey et al. | |
| 2004/0095813 A1 | 5/2004 | Hosotani | |
| 2005/0087511 A1 | 4/2005 | Sharma et al. | |
| 2006/0261425 A1 * | 11/2006 | Suemitsu et al. | 257/421 |
| 2009/0104718 A1 | 4/2009 | Zhong et al. | |
| 2009/0140358 A1 | 6/2009 | Nakayama et al. | |
| 2010/0102406 A1 | 4/2010 | Xi et al. | |
| 2010/0173173 A1 | 7/2010 | Katou | |
| 2010/0259960 A1 | 10/2010 | Samachisa | |
| 2011/0007543 A1 | 1/2011 | Khoury | |
| 2011/0014500 A1 | 1/2011 | Horng et al. | |
| 2011/0076784 A1 | 3/2011 | Druist et al. | |
| 2012/0040207 A1 | 2/2012 | Horng et al. | |
| 2012/0135273 A1 | 5/2012 | Horng et al. | |
| 2012/0225499 A1 | 9/2012 | Nozieres et al. | |
| 2013/0069185 A1 * | 3/2013 | Saida et al. | 257/422 |
| 2013/0146996 A1 * | 6/2013 | Yu et al. | 257/421 |
| 2016/0118402 * | 4/2016 | Ramaswamy | H01L 27/1157 257/326 |

FOREIGN PATENT DOCUMENTS

| | | | | |
|---|---|---|---|---|
| JP | 2003197872 A | 7/2003 | | |
| JP | 2004071881 A | 3/2004 | | |
| JP | 2004128229 A | 4/2004 | | |
| JP | 2006179701 A | 7/2006 | | |
| JP | 2007103692 A | 4/2007 | | |
| KR | 10-2004-0092342 A | 11/2004 | | |
| WO | 2008146610 A1 | 12/2008 | | |
| WO | WO 2008/146610 | * 12/2008 | | H01L 21/8246 |
| WO | 2010117911 A2 | 10/2010 | | |
| WO | 2011123357 A1 | 10/2011 | | |

OTHER PUBLICATIONS

PCT International Search Report, International Application No. PCT/US2013/058632, (Dec. 26, 2013), 3 pages.

Written Opinion of the International Searching Authority, International Application No. PCT/US2013/058632, (Dec. 26, 2013), 5 pages.

Office Action and Search Report for Taiwanese Application No. 102133264, (issued Dec. 31, 2015), 5 pages (9 pages with translation).

Japanese Office Action for Japanese Application No. 2015-531982, (dated Apr. 19, 2016), 17 pages. (including translation).

European Supplemental Partial Search Report for European Patent Application No. EP 13 83 6514, (dated Mar. 7, 2016), 6 pages.

* cited by examiner

METHODS OF FORMING MAGNETIC MEMORY CELLS

TECHNICAL FIELD

The present disclosure, in various embodiments, relates generally to the field of memory device design and fabrication. More particularly, this disclosure relates to design and fabrication of memory cells having stepped structures, i.e., structures having one portion defining a smaller perimeter than another portion.

BACKGROUND

Magnetic Random Access Memory (MRAM) is a non-volatile computer memory technology based on magnetoresistance. One type of MRAM cell is a spin torque transfer MRAM (STT-MRAM) cell. A conventional STT-MRAM cell includes a magnetic cell core supported by a substrate. The magnetic cell core includes at least two magnetic regions, for example, a "fixed region" and a "free region," with a non-magnetic region in between. An STT-MRAM cell may be configured to exhibit a vertical magnetic orientation in both the fixed region and the free region, or may be configured to exhibit a horizontal magnetic orientation in both the fixed region and the free region. The fixed region has a fixed magnetic orientation, while the free region has a magnetic orientation that may be switched, during operation of the cell, between a "parallel" configuration, in which the magnetic orientation of the fixed region and the magnetic orientation of the free region are directed in the same direction (e.g., north and north, east and east, south and south, or west and west, respectively), and an "anti-parallel" configuration, in which the magnetic orientation of the fixed region and the magnetic orientation of the free region are directed in opposite directions (e.g., north and south, east and west, south and north, or west and east, respectively). In the parallel configuration the STT-MRAM cell exhibits a lower electrical resistance across the magnetoresistive elements, i.e., the fixed region and free region. This state of relatively low electrical resistance may be defined as a "0" state of the MRAM cell. In the anti-parallel configuration, the STT-MRAM cell exhibits a higher electrical resistance across the magnetoresistive elements, i.e., the fixed region and free region. This state of relatively high electrical resistance may be defined as a "1" state of the MRAM cell. Switching of the magnetic orientation of the free region and the resulting high or low resistance states across the magnetoresistive elements enables the write and read operations of the conventional MRAM cell.

Conventional fabrication methods for forming STT-MRAM cell structures may include selective removal of materials from precursor structures of stacked materials. The materials to be removed may include elements with relatively high atomic weights, which may present a challenge to volatilization during a conventional dry etch process. Further, volatilized elements may undesirably redeposit on the structures being etched, rather than being completely removed during the etching process. Still further, as the dimensions of STT-MRAM cell structures decrease, e.g., below about thirty nanometers, so as to increase device density on a wafer, achieving uniformity in the structures of STT-MRAM cells during fabrication may present a challenge.

DETAILED DESCRIPTION

Figure 1:
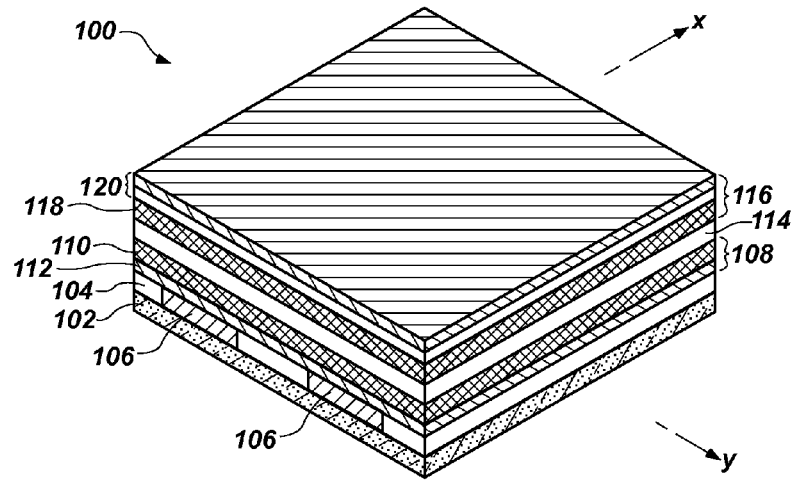
FIG. 1 is an isometric schematic illustration of a precursor structure from which an array of STT-MRAM cells is to be fabricated.

Methods of forming memory cells, methods of forming magnetic memory cells, and related memory cell structures and arrays of magnetic memory cell structures are disclosed. The methods include a sequence of patterning, selective removal, or other removal acts to form a stepped feature structure from a precursor structure having a lower section with a magnetic material, an upper section with another magnetic material, and a material, e.g., a non-magnetic material, therebetween. The upper section is patterned parallel to an axis, e.g., an "x-axis," to form an elongate feature in the upper section. The non-magnetic material and the lower section are also patterned parallel to the x-axis to form an elongate feature in the lower section having a broader width than the elongate feature in the upper section. This stepped elongate feature having the narrower upper elongate feature and the broader lower elongate feature sections may be further patterned to form a stepped structure having at least a discrete upper section. For example, the narrower upper elongate feature may be patterned parallel to another axis, e.g., a "y-axis," that is perpendicular to or about perpendicular to the x-axis, to form a discrete upper feature or discrete upper features. Accordingly, an array of magnetic memory cells may be formed in which an elongate feature, including the magnetic material, supports a plurality of upper discrete features, including the another magnetic material. The non-magnetic material separates the elongate feature including the magnetic material from the discrete features including the another magnetic material. Thus, the another magnetic material within the discrete features may form free regions of STT-MRAM cell core structures while the magnetic material within the elongate feature may form fixed regions of the STT-MRAM cell core structure. Select devices may be formed on the discrete features. As another example, not only may the narrower upper elongate feature be patterned parallel to the y-axis, the broader lower elongate feature section may also be patterned parallel to the y-axis, e.g., at a longer length than that at which the upper elongate feature is patterned parallel to the y-axis. Accordingly, an array of magnetic memory cells may be formed in which each cell core has a stepped structure including a lower discrete feature section having at least one of a broader width and longer length than an upper discrete feature section. The lower discrete feature section may include the fixed region of the magnetic memory cell, and the upper discrete feature section may include the free region of the magnetic memory cell.

Because the patterning of the precursor structure, during the series of patterning acts, may include removing material parallel to only one axis in the act, the individual patterning acts may be simplified, which may increase the uniformity of the resulting, formed structures from one cell core structure of an array to the next. Further, the patterning acts may be accomplished with tools such as ion-milling tools, which may be directed parallel to the axis of concern and may reduce the likelihood of displaced material from redepositing on sidewalls of the structure during patterning. This, again, may improve the uniformity of the resulting structure from one cell core structure to the next.

As used herein, the term "substrate" means and includes a base material or construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that may include a magnetic tunnel junction ("MTJ"), if a non-magnetic region, disposed between the free region and the fixed region, is electrically insulative (e.g., a dielectric). Alternatively, the magnetic cell structure of the STT-MRAM cell may include a spin valve, if the non-magnetic region, disposed between the free region and the fixed region, is electrically conductive.

As used herein, the term "stepped," when used with regard to a feature, means and includes a feature defining, in a lower section, a width or length and defining, in an upper section, another width or length differing from the width or length, respectively in the lower section, without regard to spacers or fill materials. For example, the stepped feature may define a broader width or longer length in the lower section and a relatively narrower width or shorter length, respectively, in the upper section.

As used herein, the term "cell core" means and includes a memory cell structure comprising the free region and fixed region and through which, during operation of the memory cell, current flows to effect a parallel or anti-parallel magnetic orientation within the free region.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to the width or length of the respective region. "Horizontal" may also mean and include a direction that is parallel to a primary surface of the substrate on which the STT-MRAM cell is located.

As used herein, the term "magnetic material" means and includes both ferromagnetic materials and ferrimagnetic materials.

As used herein, the term "width" means a dimension, from one sidewall of a feature to another sidewall of the feature, along an axis in a plane parallel to a primary surface of a base material supporting the feature. Correspondingly, the term "length" means a dimension, from one end wall of the feature to another end wall of the feature, along another axis that is perpendicular to or about perpendicular to the axis on which the width is defined, the another axis also being in the plane parallel to the primary surface of the base material supporting the feature. Notably, dimensions referred to herein as a "width" and a "length" of a feature may be otherwise referred to as a "length" and a "width," respectively, without altering the meaning of the disclosure.

As used herein, the term "neighboring," when referring to a material, region, or feature, means and refers to a next, most proximal material, region, or feature of an identified composition or structure.

As used herein, the term "fixed region" means and includes a region within the STT-MRAM cell that includes magnetic material and that has a fixed magnetic orientation during use and operation of the STT-MRAM cell in that a current effecting a change in the magnetization direction of one magnetic region, e.g., the free region, of the cell core may not effect a change in the magnetization direction of the fixed region.

As used herein, the term "free region" means and includes a region within the STT-MRAM cell that includes magnetic material and that has a switchable magnetic orientation during use and operation of the STT-MRAM cell. The magnetic orientation may be switched between a "parallel" direction, in which the magnetic orientation exhibited by the free region and the magnetic orientation exhibited by the fixed region are directed in the same direction, and an "anti-parallel" direction, in which the magnetic orientation exhibited by the free region and the magnetic orientation exhibited by the fixed region are directed in opposite directions from one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, dimensionally relative terms such as "narrow," "narrower," "broad," "broader," "short," "shorter," "long," "longer," and the like, may be used for ease of description to describe one feature's dimension along an axis relative to another feature's dimension along the axis. Thus, a feature may be described as having a "narrower" width and another feature may be described as having a "broader" width, though the width of both the feature and the another feature may be narrower than a width of a conventional feature. Accordingly, reference to a dimension as being "broader" or "longer" is not meant to imply that a large dimension is preferred.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to isometric and cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A method of forming a memory cell is disclosed. The method comprises patterning a precursor structure to form a stepped structure including at least an upper discrete feature section and a lower feature section with a broader width, length, or both than the upper discrete feature section. The method uses patterning acts directed parallel to a first axis, e.g., an x-axis, and then parallel to a second axis, e.g., a y-axis, that is perpendicular to or about perpendicular to the first axis. The patterning acts may therefore allow for more uniformity between a plurality of formed, neighboring cell core structures, even at dimensions below about thirty nanometers.

FIG. 1 illustrates a precursor structure 100 from which a plurality of stepped features may be formed according to embodiments of the present disclosure. The precursor structure 100 may be supported on a substrate 102 having thereon a base material 104. A bottom conductive material 106 may be supported by the substrate 102 and may be disposed within or on the base material 104. The bottom conductive material 106, which may include, for example and without limitation, copper, tungsten, titanium, or a combination thereof, may be formed in elongate features aligned along a length of the base material 104. In other embodiments, e.g., embodiments in which a memory cell structure to be formed is to be used in association with an underlying transistor select device, the bottom conductive material 106 may be formed as discrete features within the base material 104. Accordingly, though FIGS. 1 through 12A illustrate the bottom conductive material 106 formed as elongate features, the bottom conductive material 106 may be otherwise formed in a pattern of discrete features.

On the base material 104 and on the bottom conductive material 106 may be formed a lower section 108 of the precursor structure 100. The lower section 108 includes a magnetic material 110, which may eventually be included in a fixed region of a magnetic memory cell core structure to be formed. The magnetic material 110 may include one or more materials or regions of conventional STT-MRAM cell core structures. The magnetic material 110 may exhibit a vertical magnetic orientation.

The lower section 108 may also include other materials or regions of a lower portion of a conventional STT-MRAM cell core structure, including, e.g., lower intermediary material 112. For example, and without limitation, one such lower intermediary material 112 may include a metal seed material, e.g., a nickel-based material, configured to control the crystal structure of an overlying structure.

A non-magnetic material 114 is formed on the lower section 108. The non-magnetic material 114 may include non-magnetic materials of a conventional STT-MRAM cell core structure, including, e.g., magnesium oxide (MgO). The non-magnetic material 114 may include one or more such non-magnetic materials, regions, or both.

The non-magnetic material 114 separates the lower section 108 from an overlying upper section 116. The upper section 116 of the precursor structure 100 includes another magnetic material 118, which may be the same material or a different material than that of the magnetic material 110 and may include more than one material, region, or both. The another magnetic material 118 may include any magnetic material of a conventional STT-MRAM cell core structure. The another magnetic material 118 of the precursor structure 100 may eventually be included in a free region of the magnetic memory cell core structure to be formed from the precursor structure 100. The another magnetic material 118 may exhibit a vertical magnetic orientation.

The upper section 116 may also include upper intermediary material 120. Such upper intermediary material 120 may include materials configured to ensure a desired crystal structure in materials of the cell core structure to be formed. The upper intermediary material 120 may alternatively or additionally include dipole materials, metal materials configured to aid in etching processes to be performed, barrier materials, or other materials of conventional STT-MRAM cell core structures.

Figure 2:
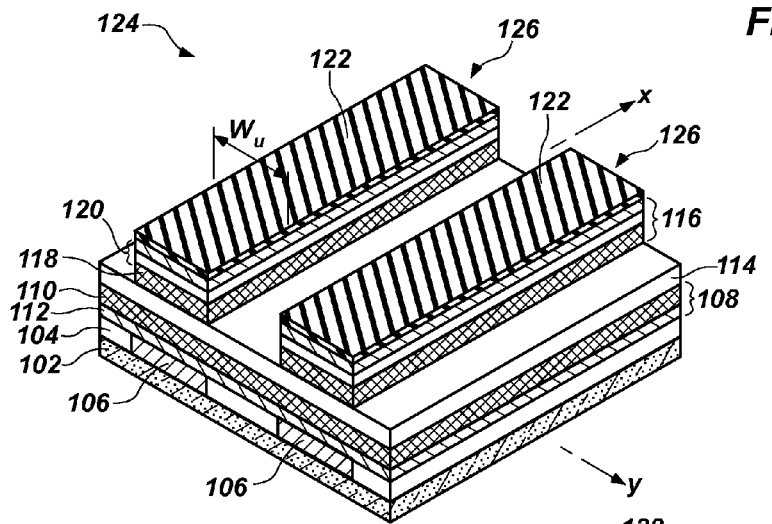
FIGS. 2 through 10 are isometric schematic illustrations of an array of discrete, stepped memory cell device structures during various stages of processing, according to an embodiment of the present disclosure, using a mask pattern of spaced elongate mask features to pattern an upper section of the precursor structure of FIG. 1 in an x direction, a spacer etch to pattern a lower section of the precursor structure in the x direction, another mask pattern of spaced elongate mask features to pattern the upper section in a y direction, and another spacer etch to pattern the lower section in they direction to form the array of discrete, stepped memory cell device structures on a base material.

As illustrated in FIG. 2, the precursor structure 100 may be patterned parallel to a first axis, referred to herein as an "x-axis." A mask 122 may be formed on an upper surface of the precursor structure 100, e.g., on an uppermost material of the upper section 116. The mask 122 may define a narrow upper elongate feature pattern of elongate features having a width $W_u$. The narrow upper elongate feature pattern of the mask 122 may be transferred to only the upper section 116 of the precursor structure 100, for example, by etching, e.g., dry etching, the upper section 116 of the precursor structure 100. The non-magnetic material 114 may function as an etch stop, enabling the transfer of the narrow upper elongate feature pattern of the mask 122 to the upper section 116. In embodiments in which the non-magnetic material 114 consists of or includes magnesium oxide, the etching process used to transfer the narrow upper elongate feature pattern to the upper section 116 of the precursor structure 100 may include, for example, etching with a chemistry including one or more of methanol, carbon dioxide, and ammonia. In other embodiments, the narrow upper elongate feature pattern of the mask 122 may be transferred to only the upper section 116 of the precursor structure 100, for example, using an ion-milling process and directing an ion beam from an ion-milling tool about parallel to the x-axis. Directing the ion beam in this manner may discourage material removed from the upper section 116 from redepositing on sidewalls of the structures. Transferring the narrow upper elongate feature pattern therefore forms a structure 124 including an upper elongate feature section in which upper elongate features 126 have the width $W_u$. The upper elongate features 126 include a remaining portion of the another magnetic material 118, as well as a remaining portion of the other materials of the upper section 116, e.g., a remaining portion of the upper intermediary material 120.

Figure 3:
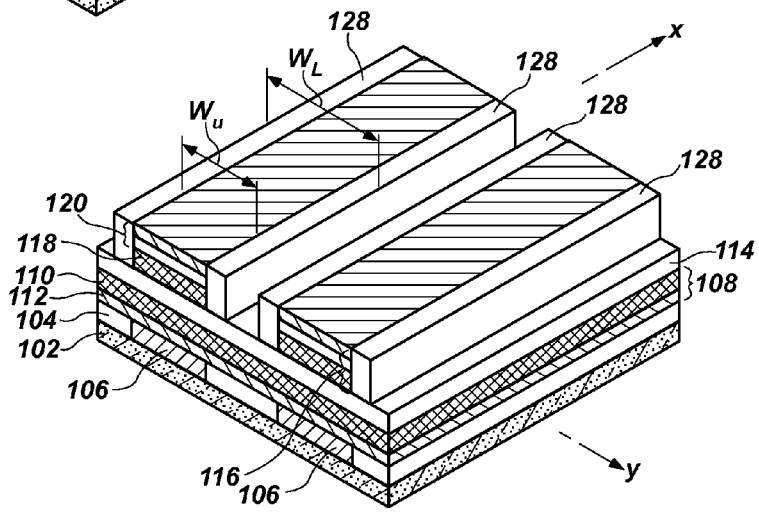

After removing the mask 122, and as illustrated in FIG. 3, or, alternatively, with the mask 122 still in place, spacers 128 may be formed on the upper elongate feature 126, e.g., on sidewalls of each of the upper elongate feature 126. The material of the spacer 128 may include any conventional spacer material, for example, and without limitation, silicon nitride. The material of the spacer material may be conformally formed over the sidewalls and upper surface of each of the upper elongate features 126. The material of the spacer 128 may then be removed from the upper surface of the upper elongate features 126 to form the spacers 128 as illustrated in FIG. 3. The upper elongate feature 126 with the spacers 128 thereon defines a broad lower elongate feature pattern of elongate features having a width $W_L$.

Figure 4:
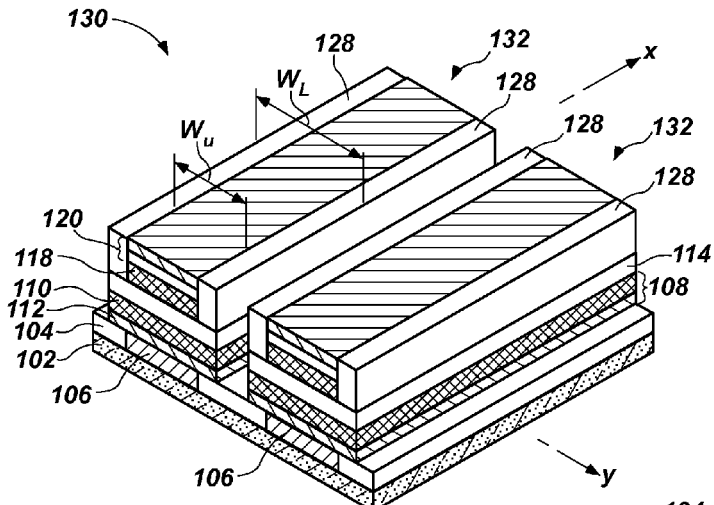

As illustrated in FIG. 4, the broad lower elongate feature pattern may be transferred down into the non-magnetic material 114 and the lower section 108 of the precursor structure 100 (FIG. 1) to form a structure 130 including stepped elongate features 132, in that the magnetic material 110 of a lower portion of the stepped elongate features 132 has width $W_L$ that is greater than width $W_u$ of the magnetic material 118 of an upper portion of the stepped elongate features 132. (Thus, the elongate feature is "stepped" without regard to the spacers 128.) For example, the non-magnetic material 114 and the lower section 108 of the precursor structure 100 may be etched, e.g., dry etched, parallel to the x-axis. Alternatively or additionally, the non-magnetic material 114 and the lower section 108 of the precursor structure 100 may be patterned using an ion-milling tool with an ion-beam directed parallel to the x-axis to discourage or prevent redeposition of removed material on sidewalls of the structure.

The stepped elongate feature 132 formed from transferring the broad lower elongate feature pattern may, therefore, include a lower broad elongate feature section and an upper narrow elongate feature section of the upper elongate features 126 (FIG. 2). The lower elongate feature section has a feature width of width $W_L$ and includes a remaining portion of the magnetic material 110 as well as a remaining portion of any lower intermediary material 112 included in the precursor structure 100 (FIG. 1). The upper narrow elongate feature section, which includes the remaining portion of the another magnetic material 118, has a feature width of width $W_u$, which is less than the width $W_L$ of the lower broad feature section.

Figure 5:
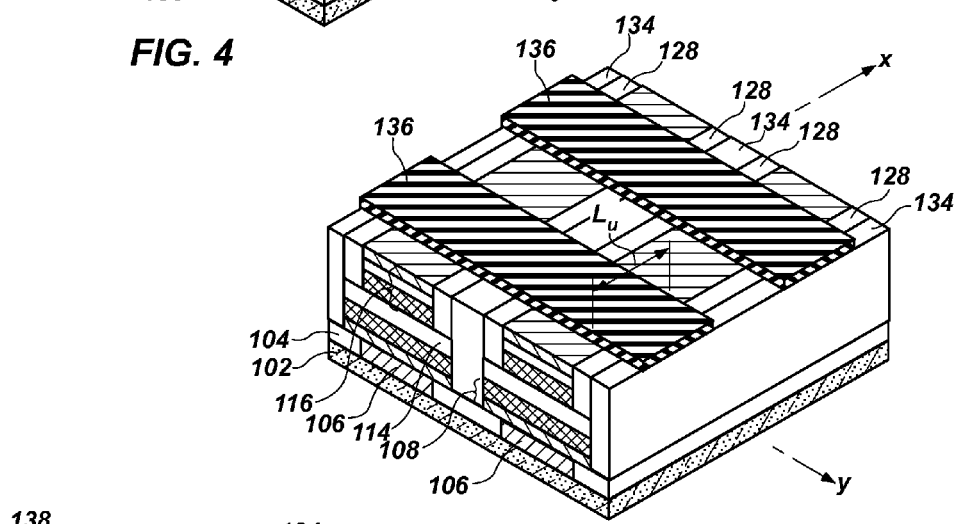

With reference to FIG. 5, a fill material 134, which may be any conventional inter-layer dielectric material of an STT-MRAM cell structure, may fill space remaining after the transfer of the broad lower elongate feature pattern to the non-magnetic material 114 and the lower section 108. The filled structure may be planarized, e.g., with CMP, and another mask 136 formed on an upper surface of the materials of the upper section 116, i.e., on the upper narrow elongate feature section. The mask 136 may define another narrow elongate feature pattern of elongate features having a length $L_u$. Length $L_u$ may be about equal to width $W_u$ (FIG. 4). In some embodiments, the mask 136 may be the same mask 122 used to define the narrow elongate feature pattern of FIG. 2, but rotated about ninety degrees in a plane parallel to a plane of the primary surface of the substrate 102 or the base material 104.

Figure 6:
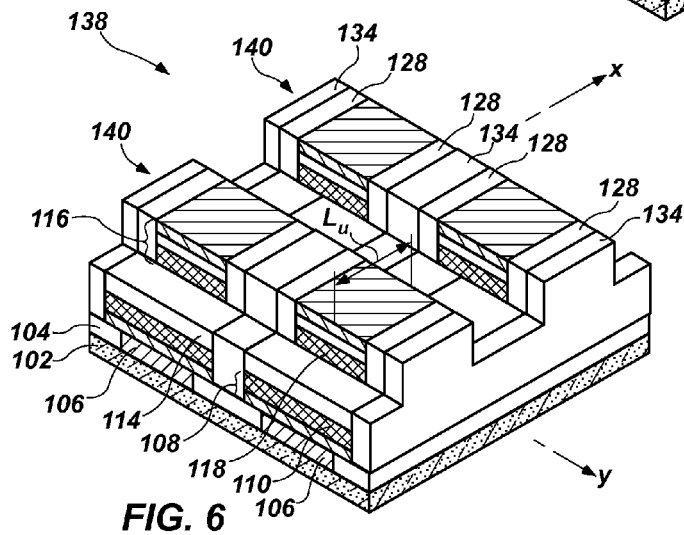

As illustrated in FIG. 6, the another narrow elongate feature pattern of the mask 136 may be transferred to at least the upper elongate feature section of the elongate features 132 (FIG. 4) to form a structure 138 including an upper discrete feature section 140. For example, the remaining portion of the another magnetic material 118, as well as a remaining portion of the intermediary material 120 (FIG. 4), may be patterned parallel to a second axis, referred to herein as the "y-axis," that is perpendicular to or about perpendicular to the x-axis. The patterning processes used to transfer the another narrow elongate feature pattern may be the same as or different from the patterning process used to transfer the narrow elongate feature pattern of FIG. 2 or to transfer the broad lower elongate feature pattern of FIG. 3. The formed structure 138 with upper discrete feature section 140 therefore includes at least upper discrete features of another remaining portion of the another magnetic material 118 spaced from a neighboring discrete feature of the another magnetic material 118 by, e.g., a wall of the spacer 128, a remaining portion of the fill material 134, and another wall of the spacer 128. The upper discrete features may define a rectangular, e.g., square, perimeter defined by width $W_u$, (FIG. 4) and length $L_u$.

In some embodiments, the structure 138 of FIG. 6 may present the final desired structure of a stepped memory cell core structure in which a plurality of discrete upper features of the another magnetic material 118 are supported over an elongate feature including the magnetic material 110. The discrete upper features of the another magnetic material 118 may form the free regions of STT-MRAM cell core structures, while the underlying region of the magnetic material 110 may form the fixed regions of the STT-MRAM cell core structures. Such stepped cell core structures with upper discrete feature sections may be configured for use with a select device on the STT-MRAM cell core structure.

Figure 7:
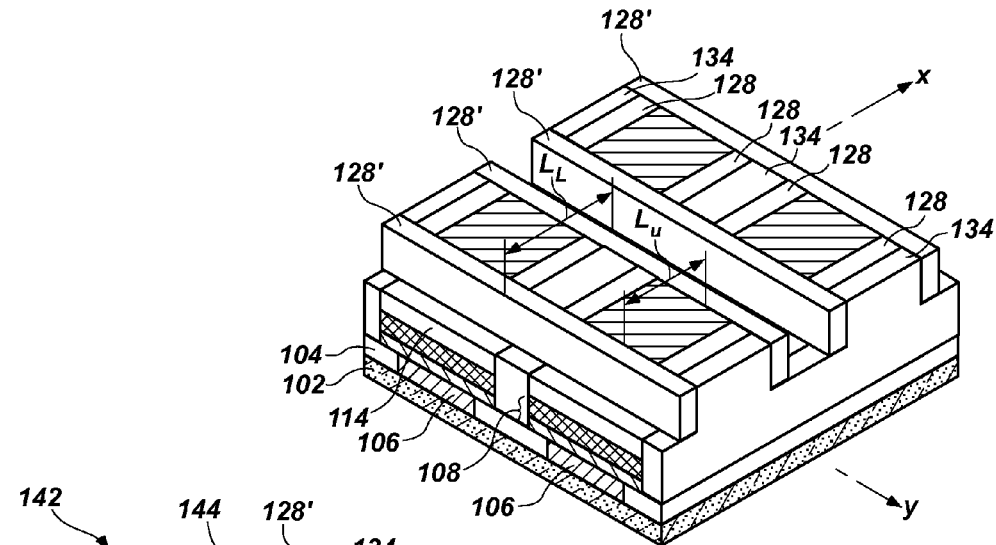

In other embodiments, e.g., those in which the STT-MRAM cell is to be used in conjunction with a transistor, a fully-discrete stepped structure may be desired. Accordingly, as illustrated in FIG. 7, spacers 128' may be formed on sidewalls of the upper discrete feature section 140 (FIG. 6) of structure 138 (FIG. 6), to define another broad lower elongate feature pattern defining a feature length $L_L$ that is greater than feature length $L_u$. Feature length $L_L$ may be about equal to feature width $W_L$. The spacers 128' may be formed by the same process as that used to form the spacer material 128 (FIG. 3) on the upper elongate feature 126 (FIG. 2).

Figure 8:
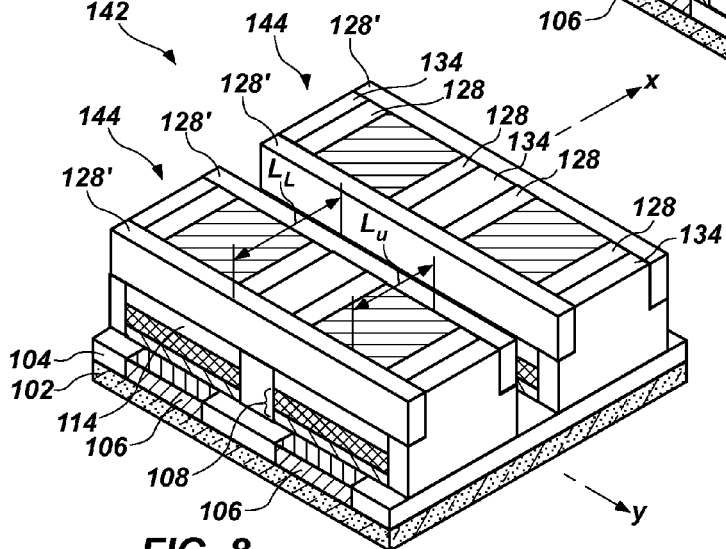

As illustrated in FIG. 8, the another broad lower elongate feature pattern may be transferred to the lower broad feature section of the stepped elongate features 132 (FIG. 4), which lower broad feature section includes the remaining portions of the non-magnetic material 114 and the remaining portion of the lower section 108. Transferring the another broad lower elongate feature pattern therefore forms a structure 142 of stepped discrete features 144 including the upper discrete feature section, including the another remaining portion of the another magnetic material 118 (FIG. 6) with width $W_u$ (FIG. 4) and length $L_u$, and including a lower discrete feature section, including the another remaining portion of the magnetic material 110 (FIG. 6) with width $W_L$ (FIG. 4) and length $L_L$.

Figure 9:
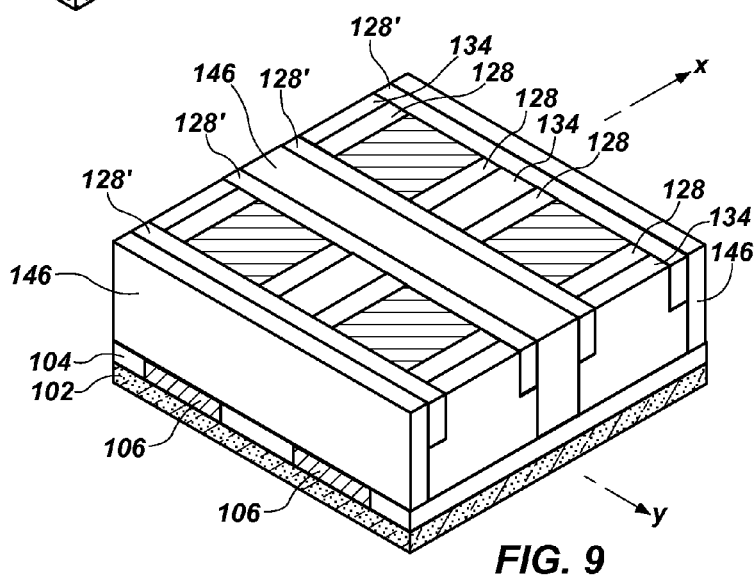

As illustrated in FIG. 9, remaining space, resulting from transferring the another broad lower elongate feature pattern, may be filled with a fill material 146, which may be the same or different from the fill material 134 and may be formed using the same or a different process by which the fill material 134 was formed. The structure with the fill material 146 may thereafter be planarized before further processing.

Figure 10:
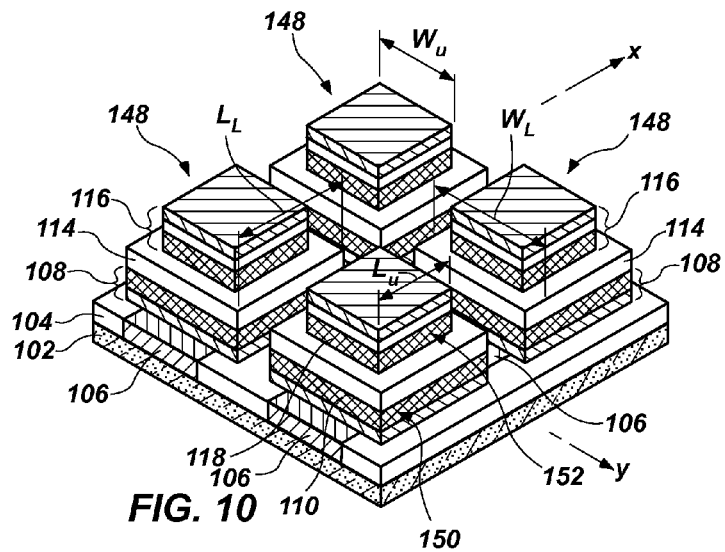

With reference to FIG. 10, illustrated is a final structure of an array of discrete core structures 148, each of which may be included in a final STT-MRAM cell. The array of discrete core structures 148 may be formed by removing the spacers 128, 128' and fill materials 134, 146. The spacers 128, 128' and fill materials 134, 146 may be removed by a single process act or by multiple process acts by conventional techniques, which are not described in detail herein. Alternatively, one or more of the spacers 128, 128' and fill materials 134, 146 may not be removed and may, instead, be included in a final STT-MRAM cell array. Thus, FIG. 10 illustrates the discrete core structures 148 of such a final, spacer-including or fill-including structure with the spacers and fill not shown for ease of illustration. Each discrete core structure 148 includes a lower discrete section, that includes the another remaining portions of the lower section 108, including the magnetic material 110, and the non-magnetic material 114 from the precursor structure 100 (FIG. 1). The lower section 108 may function as a fixed region 150 of an STT-MRAM cell. The fixed region 150 may exhibit a vertical magnetic orientation or a fixed horizontal magnetic orientation. Each discrete core structure 148 further includes an upper discrete section, each supported on a lower discrete section. The upper discrete section includes the another remaining portion of the upper section 116, including the another magnetic material 118, which may function as a free region 152 of the STT-MRAM cell. The free region 152 may exhibit a switchable vertical magnetic orientation or a switchable horizontal magnetic orientation. Because the patterning processes, used to form the resulting structure illustrated in FIG. 10, included only processes directed parallel to a straight axis, each discrete core structure 148 may define a rectangular, e.g., a square, cross section in a plane parallel with an upper surface of the base material 104. Further, the use of straight patterning processes may achieve more uniformity, from one discrete core structure 148 to the next, than a conventional patterning process utilizing patterns of more intricate design.

Figure 11:
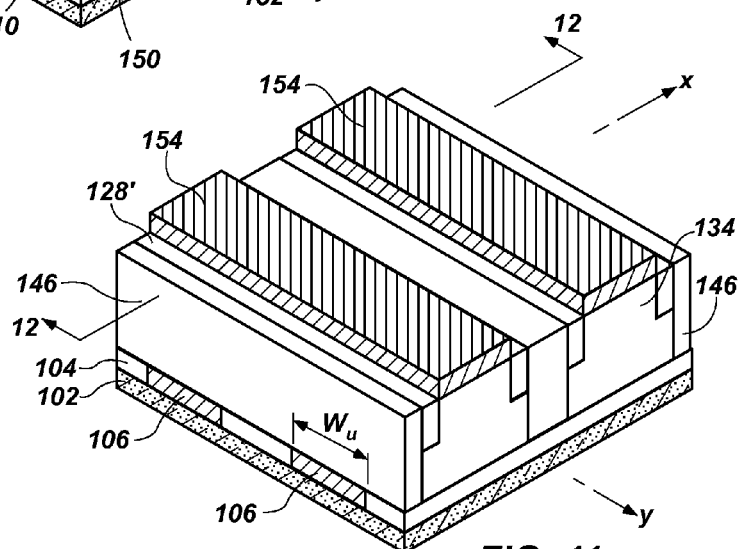
FIG. 11 is an isometric schematic illustration of the array of discrete, stepped memory cell device structures of FIG. 9 with elongate features of an upper conductive material formed thereon.
Figure 12A:
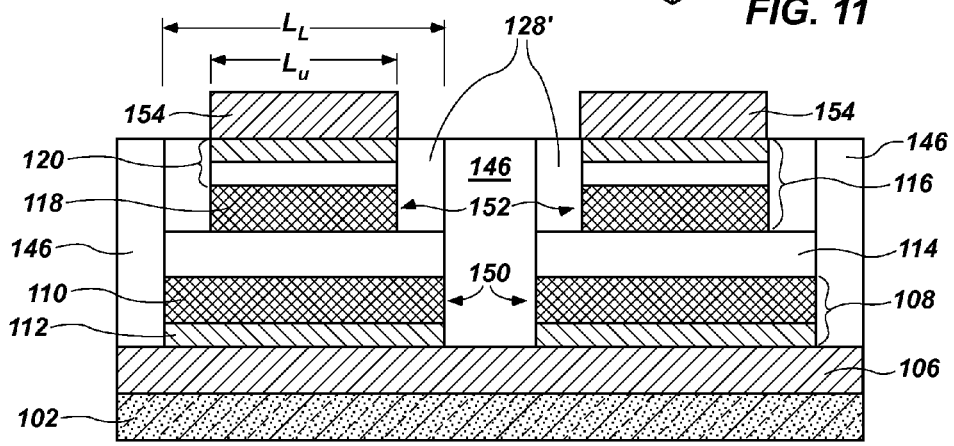
FIG. 12A is a cross-sectional view of the structure of FIG. 11, taken along section 12-12 thereof, including elongate features of bottom conductive material.

With reference to FIGS. 11 and 12A, illustrated is the structure of FIG. 9 following additional processing. For example, an upper conductive material 154 may be formed over the discrete core structures 148 (FIG. 10). The upper conductive material 154 may be the same or a different conductive material than that included in the bottom conductive material 106. The upper conductive material 154 may be formed as elongate discrete features passing over an upper surface of the upper discrete feature section of the stepped discrete features 144 (FIG. 8). The upper conductive material 154 may be aligned perpendicularly to the bottom conductive material 106, e.g., in embodiments in which the bottom conductive material 106 is formed as elongate features, in a plane parallel with an upper surface of the base material 104. Each feature of the upper conductive material 154 may be patterned to define an upper conductive feature length about equal to length $L_u$. Similarly, each bottom conductive material 106 may have been formed to define a lower conductive feature width about equal to width $W_u$.

Figure 12B:
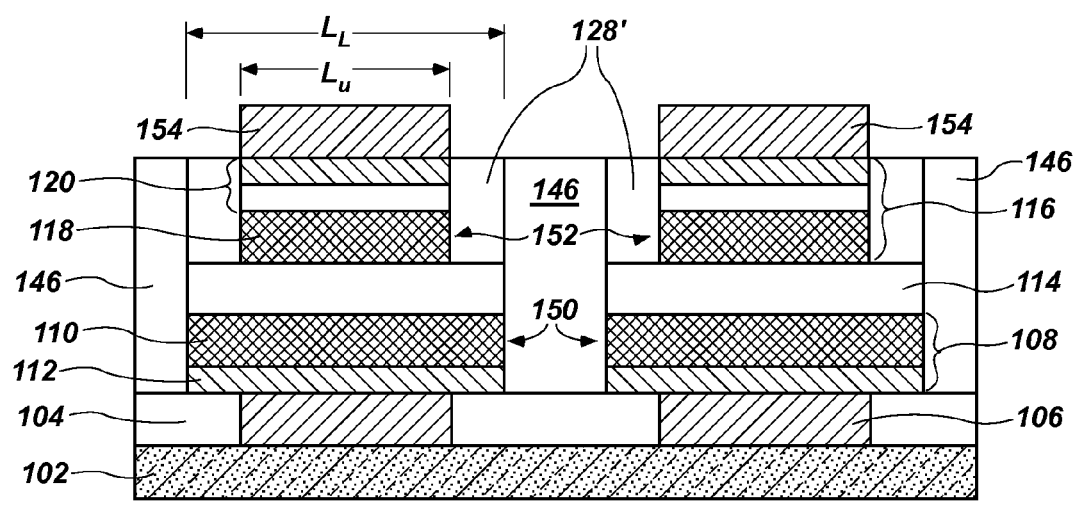
FIG. 12B is a cross-sectional view of the structure of FIG. 11, taken along section 12-12, but with discrete features of bottom conductive material rather than elongate features.

Though the embodiment illustrated in FIGS. 1 through 12A includes the bottom conductive material 106 formed as elongate features, in another embodiment, the bottom conductive material 106 may be formed as discrete features, as illustrated in FIG. 12B. Such discrete features of the bottom conductive material 106 may define a bottom conductive material length about equal to length $L_u$ and may define a bottom conductive material width about equal to width $W_u$ (FIG. 11). Such an embodiment may be configured for use with an underlying transistor select device (not shown).

Accordingly, disclosed is a method of forming a memory cell. The method comprises forming a precursor structure on a base. The precursor structure comprises a lower section, an upper section, and a material between the lower section and the upper section. The method also comprises patterning the upper section to form an upper elongate feature section defining an upper feature width. A spacer is formed on the upper elongate feature section to define a broader feature pattern. The broader feature pattern is transferred to the material and the lower section to form a lower elongate feature section. The upper elongate feature section is patterned to form an upper discrete feature section. Another spacer is formed on the upper discrete feature section to define another broader feature pattern. The another broader feature pattern is transferred to the lower elongate feature section to form a lower discrete feature section.

Figure 13:
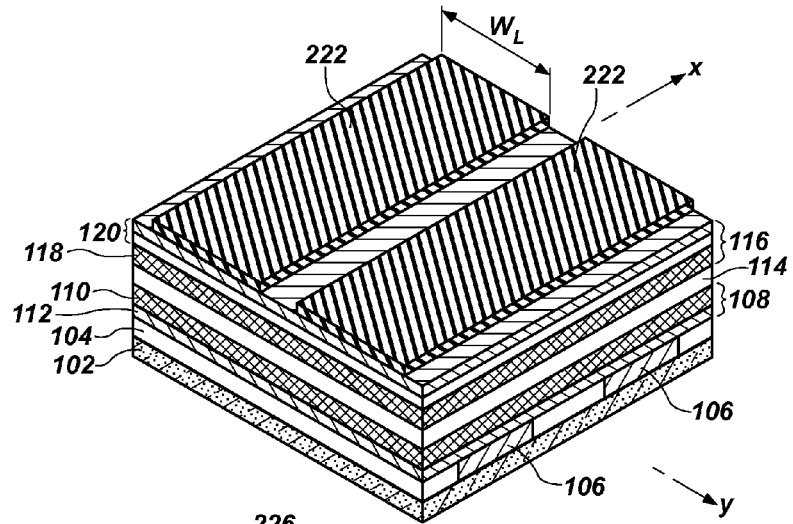
FIGS. 13 through 18 are isometric schematic illustrations of an array of discrete, stepped memory cell device structures during various stages of processing, according to an embodiment of the present disclosure, using a mask pattern of spaced elongate mask features to pattern the precursor structure of FIG. 1 to the base material in an x direction, a narrower mask pattern of spaced elongate mask features to pattern an upper section in the x direction, another mask pattern of spaced elongate mask features to pattern the structure to the base material in a y direction, and another narrower mask pattern of spaced elongate mask features to pattern the upper section in they direction to form the array of discrete stepped memory cell device structures on the base material.

With reference to FIGS. 13 through 18, also disclosed is a method for forming a stepped feature structure of a memory cell wherein the broader width $W_L$ of a lower section is first patterned through the precursor structure 100 (FIG. 1) parallel to the x-axis and then the narrower width $W_u$ of an upper section is patterned parallel to the x-axis. As illustrated in FIG. 13, however, the bottom conductive material 106 may be formed as elongate features aligned along a width of the base material 104, rather than along the length of the base material 104 as in FIG. 1. Discrete feature sections are then formed by patterning parallel to the y-axis to define the broader length $L_L$ of the resulting lower discrete section and then patterning parallel to the y-axis to define the narrower length $L_u$ of the resulting upper discrete section. Again, the use of patterning acts directed parallel to one axis accommodates simplification of the fabrication process and may improve uniformity of the resulting, discrete stepped memory cell core structure across an array of formed memory cell core structures.

Patterning acts performed according to the embodiment illustrated in FIGS. 13 through 18 may be performed using the same or different techniques than those described above with regard to FIGS. 1 through 12B. Thus, etching, e.g., dry etching, or ion-milling may be used and materials, e.g., spacers and fill materials, may be similarly formed and planarized.

Figure 14:
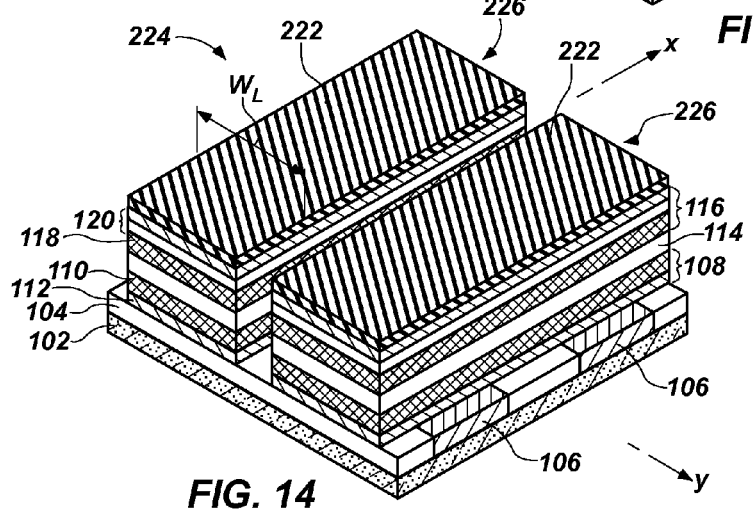

With reference to FIG. 13, a mask 222 defining the broad lower elongate feature pattern with feature width $W_L$ may be formed on an upper surface of the precursor structure 100 (FIG. 1). As illustrated in FIG. 14, the broad lower elongate feature pattern may be transferred, parallel to the x-axis, through the precursor structure 100 (FIG. 1), including the upper section 116, the lower section 108, and the non-magnetic material 114 of the precursor structure 100 (FIG. 1) to form a structure 224 including elongate precursor features 226 having width $W_L$.

Figure 15:
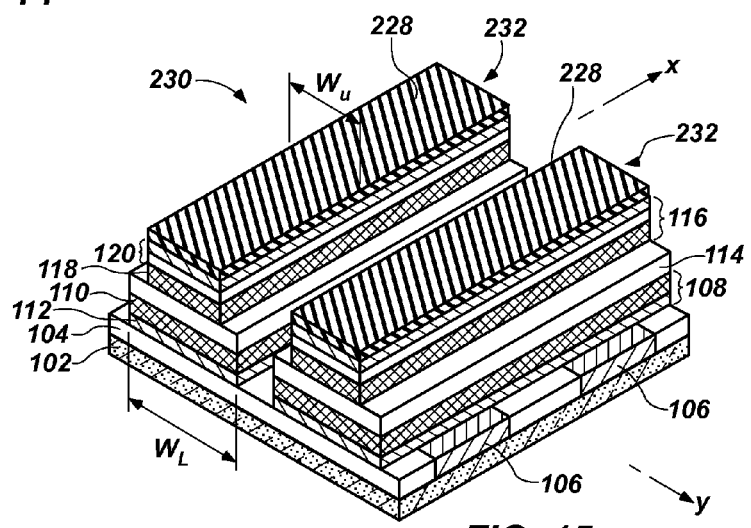

With reference to FIG. 15, a mask 228, which may be a separate mask structure from that of the mask 222 or may be derived from the mask 222, may be formed over the remaining portions of the upper section 116, the non-magnetic material 114, and the lower section 108. The mask 228 defines the narrow upper elongate feature pattern with feature width $W_u$. The narrow upper elongate feature pattern may be transferred, also parallel to the x-axis, to an upper portion of the elongate precursor feature 226, e.g., the portion including the remaining portion of the another magnetic material 118, to form a structure 230 including stepped elongate features 232 including a lower elongate feature section with width $W_L$ and an upper elongate feature section with width $W_u$. The narrow upper elongate feature pattern may be transferred to the upper portion of the elongate precursor feature 226 using, e.g., an etching process with an etching chemistry formulated to stop on the non-magnetic material 114. The mask 228 may be derived from the mask 222 by removing portions of the mask 222 to achieve the desired width $W_u$.

Figure 16:
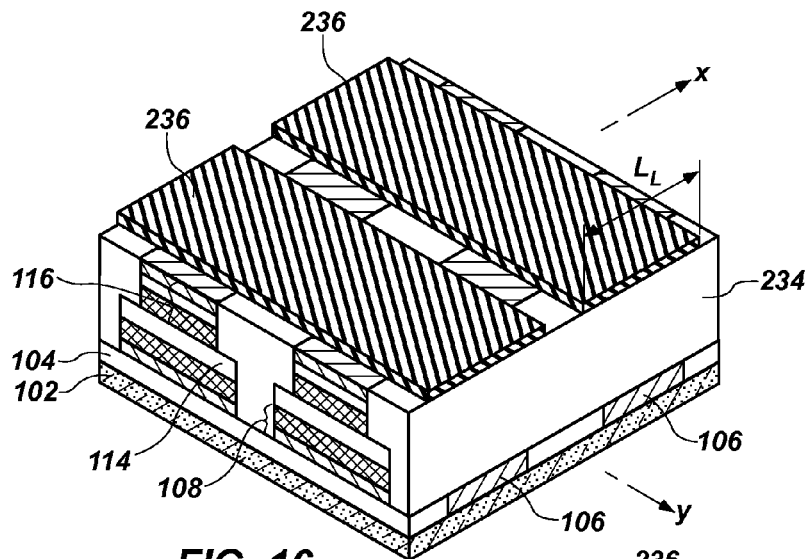

A fill material 234 may be formed within space of structure 230 and planarized, as illustrated in FIG. 16. A mask 236, defining another broad lower elongate feature pattern, may be formed thereon. The another broad lower elongate feature pattern defines feature length $L_L$, which may be about equal to width $W_L$.

Figure 17:
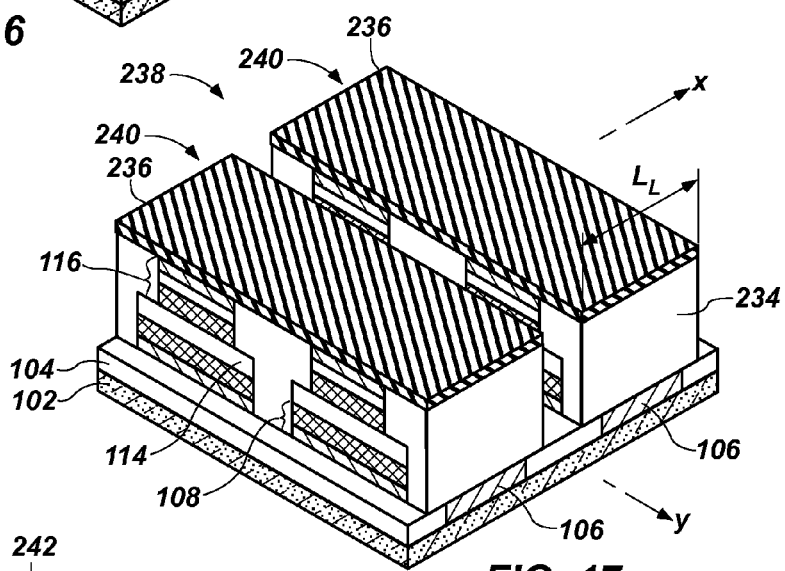

As illustrated in FIG. 17, the another broad lower elongate feature pattern may be transferred, parallel to the y-axis, through the stepped elongate features 232 (FIG. 15), stopping on the base material 104 to form a structure 238 including stepped discrete features 240, which include a lower portion having width $W_L$ (FIG. 15) and length $L_L$, and include an upper discrete feature section having width $W_u$ (FIG. 15) and length $L_L$.

Figure 18:
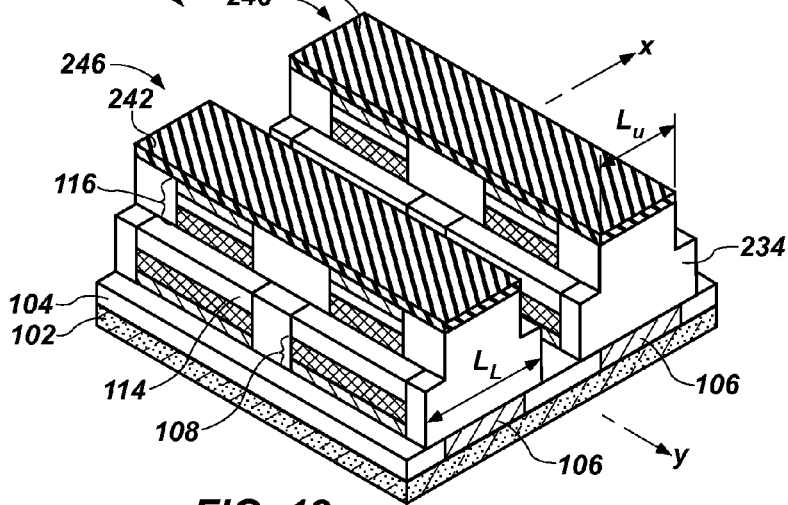

As illustrated in FIG. 18, a mask 242, which may be a separate mask structure from that of mask 236 (FIG. 16) or may be derived from the mask 236 (FIG. 16), may be formed over remaining portions of the upper section 116. The mask 242 defines the another narrow upper elongate feature pattern with feature length $L_u$, which is less than length $L_L$. The another narrow upper elongate feature pattern may be transferred to the upper portion of the stepped discrete features 240 (FIG. 17) to form a structure 244 including stepped discrete features 246 including the lower section having width $W_L$ (FIG. 15) and length $L_L$, and including an upper discrete feature section having width $W_u$ (FIG. 15) and length $L_u$. The another narrow upper elongate feature pattern may be transferred to the upper portion of the stepped discrete features 240 (FIG. 17) using, e.g., an etching process with an etching chemistry formulated to stop on the non-magnetic material 114. The mask 242 may be derived from the mask 236 by removing portions of the mask 236 to achieve the desired length $L_u$.

Accordingly, disclosed is a method of forming a memory cell, the method comprising patterning a mask material to form an elongate mask feature parallel to an axis. The elongate mask feature is patterned perpendicularly to the axis to define a discrete mask pattern defining an upper feature width and an upper feature length. The discrete mask pattern is transferred to a magnetic material disposed on a non-magnetic material and on another magnetic material to form an upper discrete feature having the upper feature width and the upper feature length. Spacers are formed on sidewalls of the upper discrete feature to define a broader feature pattern defining a lower feature width and a lower feature length. The broader discrete feature pattern is transferred to the non-magnetic material and the another magnetic material to form a lower discrete feature having the lower feature width and the lower feature length. The upper discrete feature is disposed on the lower discrete feature.

With reference to FIGS. 19 through 23, also disclosed is a method in which a mask material is patterned first parallel to the x-axis and then parallel to the y-axis, and then the defined mask pattern is transferred to the upper section 116 of a precursor structure, e.g., the precursor structure 100 (FIG. 1). However, unlike the precursor structure 100 of FIG. 1, the bottom conductive material 106 may be formed as elongate features aligned along the width of the base material 104, rather than along the length. A spacer is formed to define a broader discrete feature pattern. Then the broader discrete feature pattern is transferred to the non-magnetic material 114 and the lower section 108 of the precursor structure 100 to form an array of stepped discrete feature structures.

Patterning acts performed according to the embodiment illustrated in FIGS. 19 through 23 may be performed using the same or different techniques than those described above with regard to FIGS. 1 through 12B and FIGS. 13 through 18. Thus, etching, e.g., dry etching, or ion-milling may be used and materials, e.g., spacers and fill materials, may be similarly formed and planarized.

Figure 19:
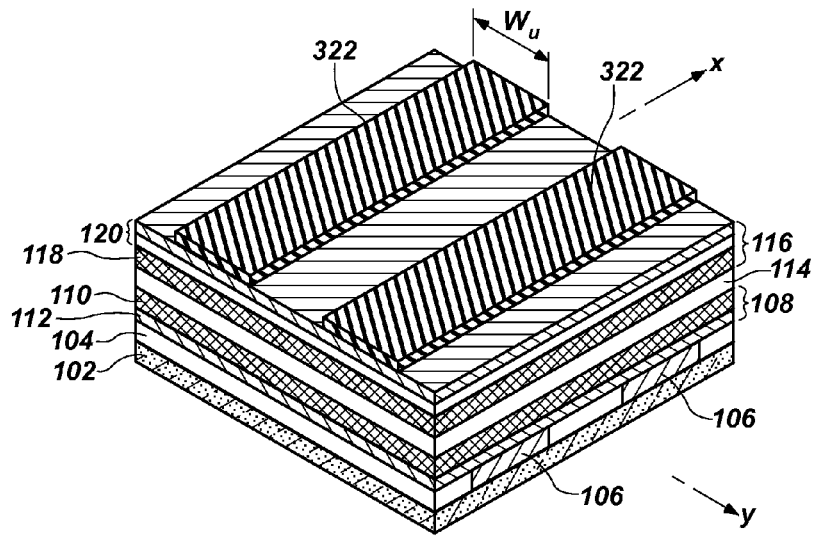
FIGS. 19 through 23 are isometric schematic illustrations of an array of discrete, stepped memory cell device structures during various stages of processing, according to an embodiment of the present disclosure, using a mask pattern of spaced elongate mask features, forming from the mask pattern another mask pattern of discrete mask features, using the another mask pattern of discrete mask features to pattern an upper section of the precursor structure of FIG. 1, and a spacer etch to pattern a lower section of the precursor structure to form the array of discrete, stepped memory cell device structures on a base material.
Figure 20:
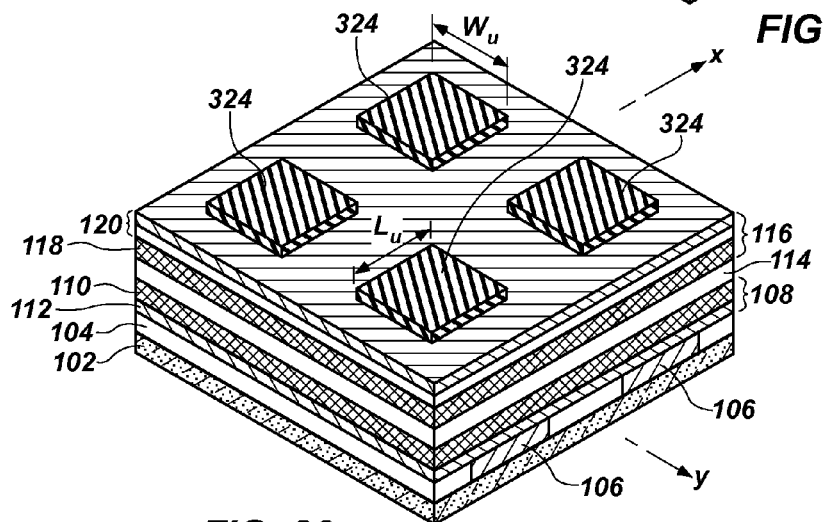

As illustrated in FIG. 19, a mask 322 may be formed on the precursor structure 100 (FIG. 1) and patterned parallel to the x-axis to define the narrow upper elongate feature pattern with feature width $W_u$. The mask 322 may then be patterned parallel to the y-axis, as illustrated in FIG. 20, to define a narrow upper discrete feature pattern of discrete mask features 324 having feature width $W_u$ and the feature length $L_u$.

Figure 21:
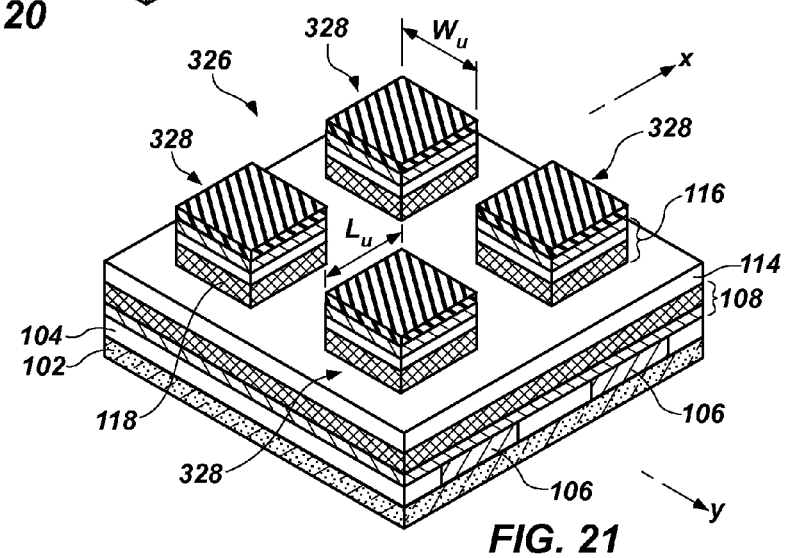

The narrow upper discrete feature pattern may be transferred to the upper section 116 of the precursor structure 100 (FIG. 1), as illustrated in FIG. 21, to form a structure 326 including an upper discrete feature section 328. Thus, the another magnetic material 118 of the precursor structure 100 (FIG. 1) is patterned in discrete regions having width $W_u$ and length $L_u$ on an as-yet undefined region of the non-magnetic material 114.

Figure 22:
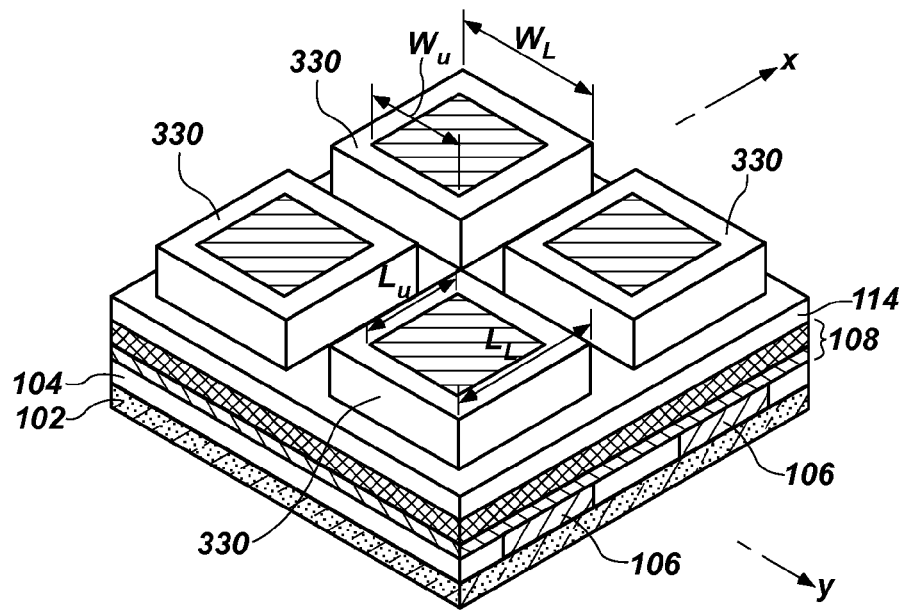

As illustrated in FIG. 22, a spacer 330, which may be formed from the same material or a different material as spacers 128 (FIG. 3) or spacers 128' (FIG. 7), may be conformally formed on sidewalls of the upper discrete feature section 328 (FIG. 21) to define a broad lower discrete feature pattern with feature width $W_L$ and feature length $L_L$.

Figure 23:
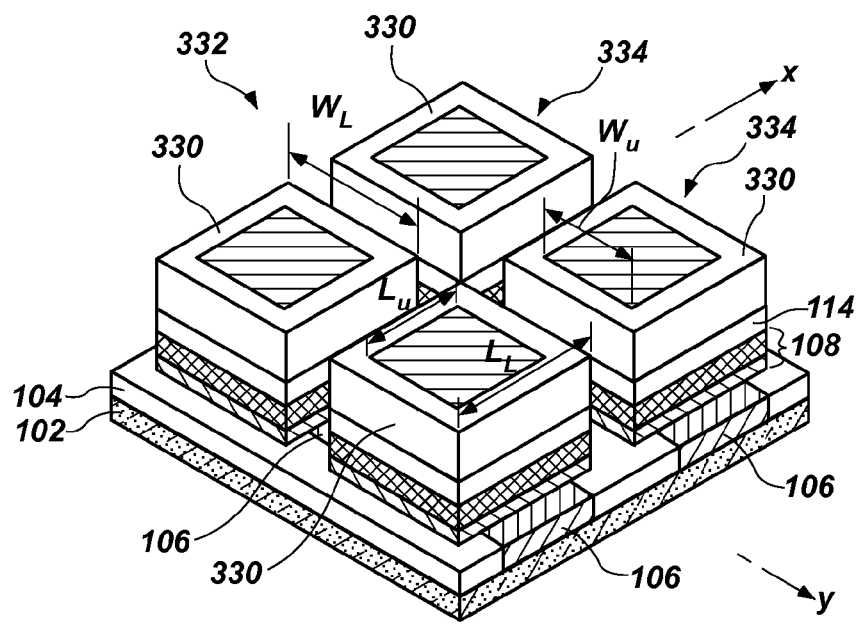

As illustrated in FIG. 23, the broad lower discrete feature pattern may be transferred to the non-magnetic material 114 and the lower section 108 of the precursor structure 100 (FIG. 1) to form a structure 332 including stepped discrete features 334. In some embodiments, the spacers 330 may be removed. In other embodiments, the spacers 330 are not removed prior to completion of the fabrication.

Accordingly, disclosed is a method of forming a memory cell, the method comprising patterning a precursor structure parallel to an x-axis, the precursor structure comprising a lower section, an upper section, and a non-magnetic material between the lower section and the upper section, to form an elongate stepped feature structure comprising a lower elongate feature section defining a lower feature width and comprising an upper elongate feature section defining an upper feature width less than the lower feature width. The method also comprises patterning the elongate stepped feature structure parallel to a y-axis about perpendicular to the x-axis to form an at least partially discrete stepped feature structure comprising an upper discrete feature section.

Also disclosed is a method of forming a magnetic memory cell, the method comprising selectively removing at least one portion of a magnetic material from an upper section of a precursor structure to form an upper elongate feature section comprising a remaining portion of the magnetic material supported on a non-magnetic material separating the magnetic material from another magnetic material on a base material, the upper elongate feature section defining an upper feature width. At least one portion of the non-magnetic material and at least one portion of the another magnetic material are selectively removed to form a lower elongate feature section between the upper elongate feature section and the base material, the lower elongate feature section comprising a remaining portion of the non-magnetic material and a remaining portion of the another magnetic material. At least one other portion of the magnetic material from the upper elongate feature section is selectively removed to form an upper discrete feature section comprising another remaining portion of the magnetic material supported on the remaining portion of the non-magnetic material separating the another remaining portion of the magnetic material from the remaining portion of the another magnetic material on the base material. At least one other portion of the non-magnetic material and at least one other portion of the another magnetic material from the lower elongate feature section are selectively removed to form a lower discrete feature section comprising another remaining portion of non-magnetic material and another remaining portion of the another magnetic material.

Figure 24:
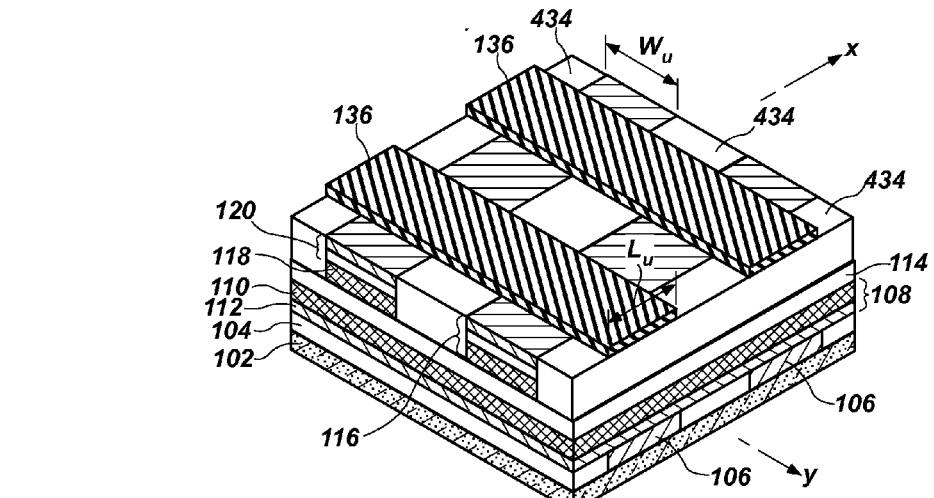
FIGS. 24 through 29 are isometric schematic illustrations of an array of stepped memory cell device structures with elongate lower sections and discrete upper sections during various stages of processing, according to an embodiment of the present disclosure, using a mask pattern of spaced elongate mask features to pattern an upper section of the precursor structure of FIG. 1 in an x direction, another mask pattern of spaced elongate mask features to pattern the upper section in a y direction, and a spacer etch to pattern the lower section in they direction to form the array of stepped memory cell device structures with elongate lower sections and discrete upper sections on a base material.
Figure 25:
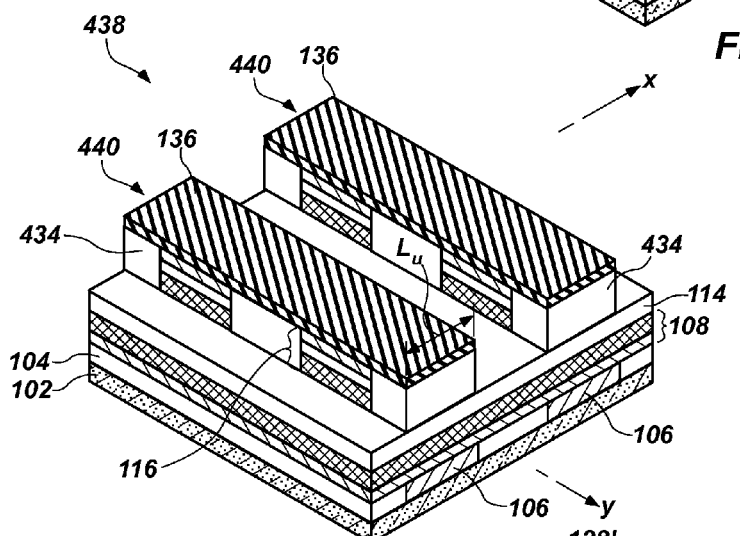

With reference to FIGS. 24 through 29, disclosed is a method of forming a stepped feature structure of a magnetic memory cell including a lower elongate feature section and an upper discrete feature section. The structure 124 of FIG. 2 may be formed as described above, the mask 122 (FIG. 2) removed, and a fill material 434 used to fill the space remaining, as illustrated in FIG. 24. However, as also illustrated in FIG. 24, the bottom conductive material 106 may be formed as elongate features aligned along a width of the base material 104, rather than along a length. The mask 136 defining the another narrow upper elongate feature pattern may be formed over the structure and the another narrow upper elongate feature pattern transferred to the upper elongate features 126 (FIG. 2) of the structure 124 (FIG. 2). Mask 122 (FIG. 2) may be removed, prior to forming mask 136 over the filled structure, to form a structure 438 including an upper discrete feature section 440, as illustrated in FIG. 25.

Figure 26:
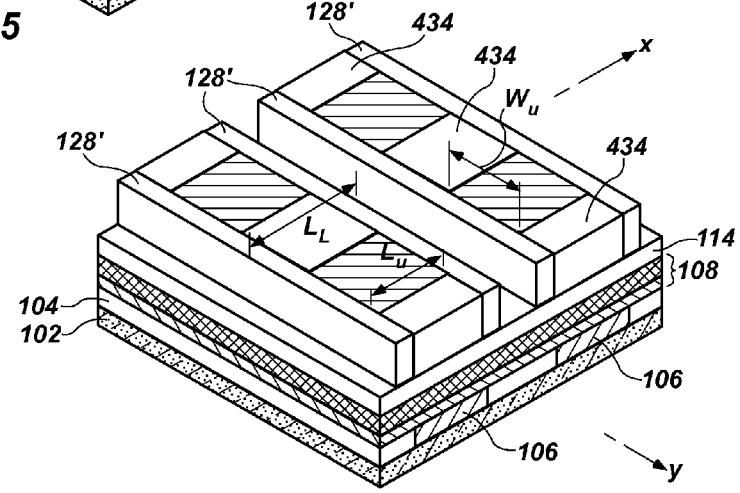
Figure 27:
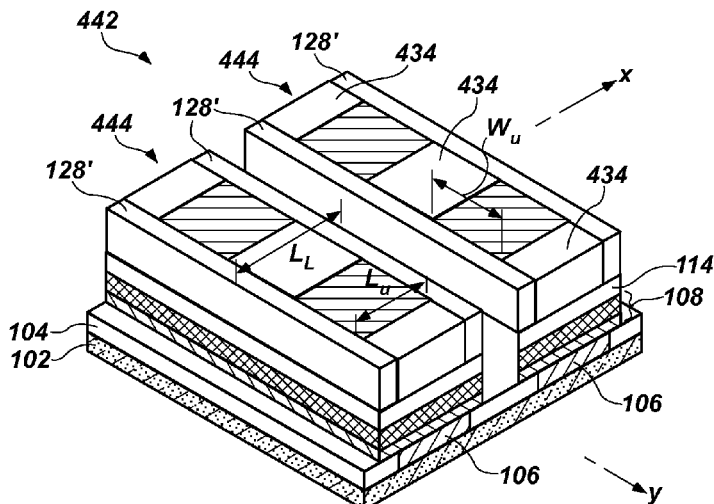
Figure 28:
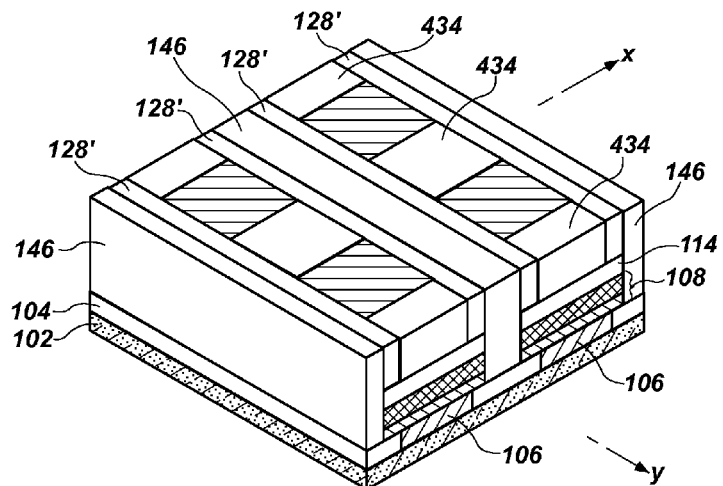

As illustrated in FIG. 26, the spacers 128' may be formed on sidewalls of the upper discrete feature section 440 (FIG. 25) to define the another broad lower elongate feature pattern, which may be transferred to the remaining portions of the non-magnetic material 114 and the lower section 108, as illustrated in FIG. 27, to form a structure 442 including stepped feature structures 444 including the lower elongate feature section and the upper discrete feature section with remaining portions of the fill material 434, as illustrated in FIGS. 27 and 28. Though FIGS. 26 and 27 do not illustrate the mask 136 (FIG. 25) still in place over the upper discrete feature section 440 (FIG. 25), it is contemplated that the mask 136 (FIG. 25) may not be removed before the spacers 128' are formed and the another broad lower elongate feature pattern transferred to the remaining portions of the non-magnetic material 114 and the lower section 108.

In some embodiments, the remaining portions of the fill material 434 and spacers 128' are not removed before further processing. In such embodiments, fill material 146 may fill space in the structure before subsequent processing, as illustrated in FIG. 28. In other embodiments, the remaining portions of the fill material 434 and spacers 128' are removed before further processing.

Figure 29:
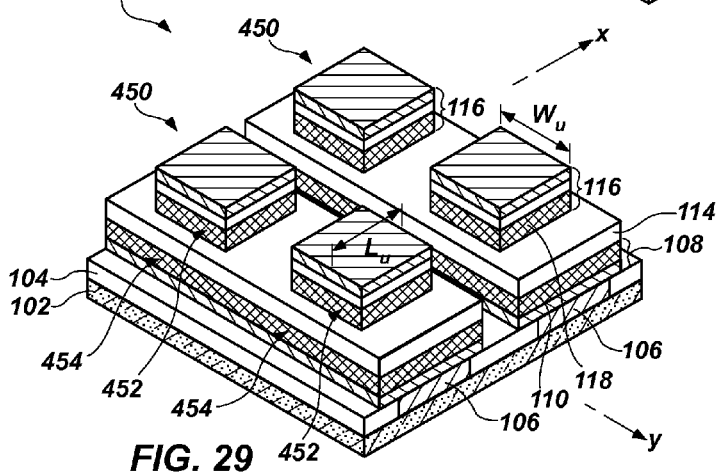

With the remaining portions of the fill material 434 and spacers 128' removed, either during subsequent processing or solely for ease of illustration, FIG. 29 illustrates the final structure 448 including the stepped feature structures 450 with an elongate feature, having an elongate feature length of length $L_L$ (FIG. 27), and with a plurality of discrete features, each having the discrete feature length $L_u$ and discrete feature width $W_u$, disposed on the elongate feature. The elongate feature of the final structure 448 therefore includes the magnetic material 110 and the non-magnetic material 114, both having length $L_L$ (FIG. 27). Each of the discrete features includes the another magnetic material 118. The discrete regions of the another magnetic material 118 form free regions 452 of an STT-MRAM cell, and the elongate regions of the magnetic material 110 form fixed regions 454 of an STT-MRAM cell array.

Accordingly, disclosed is an array of magnetic memory cell structures, the array comprising at least one elongate feature defining an elongate feature length. The at least one elongate feature comprises a magnetic material having the elongate feature length on a base material. The at least one elongate feature also comprises a non-magnetic material having the elongate feature length on the magnetic material. The array also comprises a plurality of discrete features each defining a discrete feature length less than the elongate feature length. Each discrete feature of the plurality of discrete features comprises another magnetic material. The plurality of discrete features is disposed on the at least one elongate feature.

Figure 30:
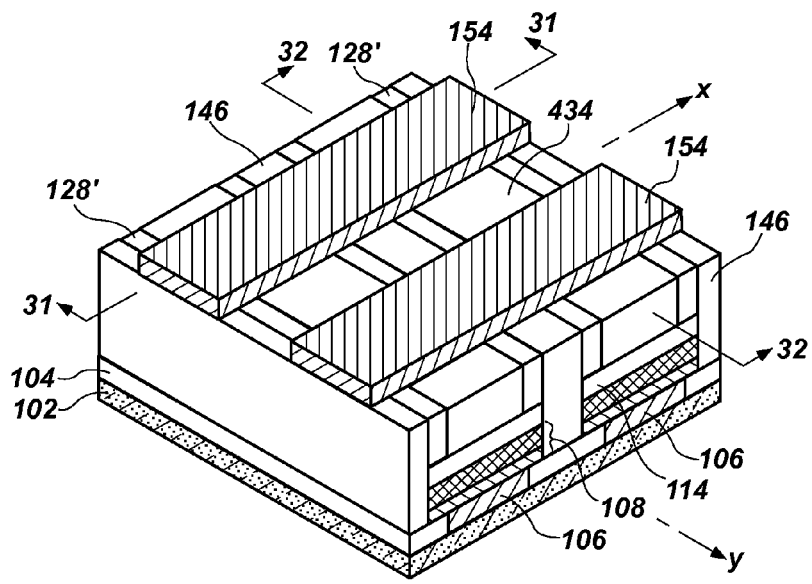
FIG. 30 is an isometric schematic illustration of the array of stepped memory cell device structures with elongate lower sections and discrete upper sections of FIG. 28 with elongate features of an upper conductive material formed thereon.
Figure 31:
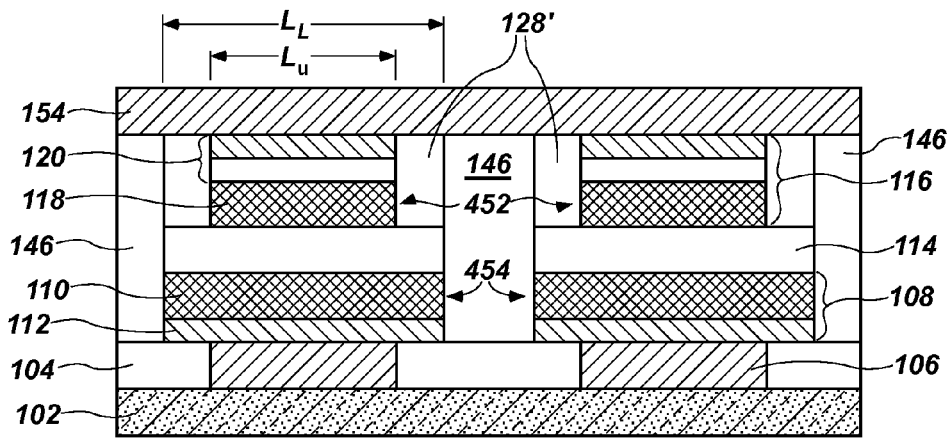
FIG. 31 is a cross-sectional view of the structure of FIG. 30 taken along section 31-31 thereof.
Figure 32:
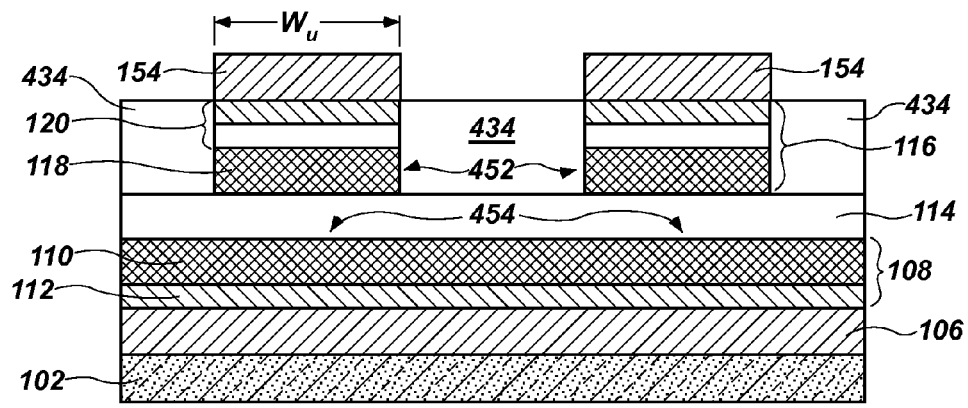
FIG. 32 is a cross-sectional view of the structure of FIG. 30 taken along section 32-32 thereof.

With reference to FIGS. 30 through 32, further processing of the stepped feature structure 448 (FIG. 29), with the remaining portions of the fill material 434, the spacers 128' and the fill material 146, as illustrated in FIG. 28, may include formation of the upper conductive material 154 as described above with regard to FIGS. 11 and 12B. However, the upper conductive material 154 may be aligned parallel to the x axis and perpendicular to elongate features of the bottom conductive material 106. The upper conductive material 154 of the present embodiment may be perpendicularly disposed to the lower elongate region of the magnetic material 110.

Figure 33:
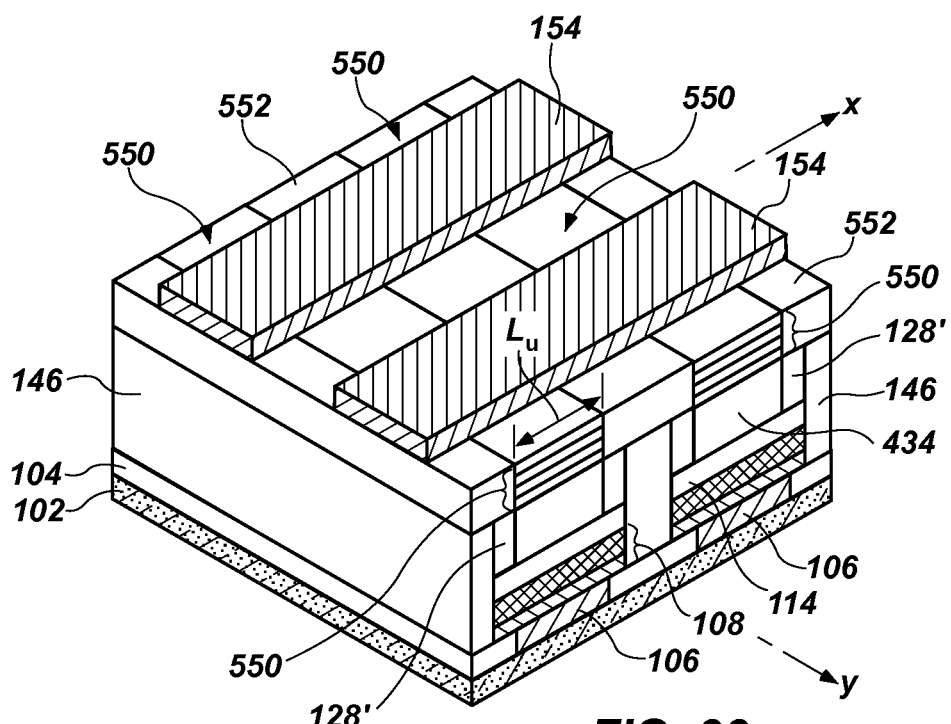
FIG. 33 is an isometric schematic illustration of the array of stepped memory cell device structures of FIG. 28 with select devices and elongate features of an upper conductive material formed thereon.

With reference to FIG. 33, in some embodiments, the method may include formation of a select device 550 over the stepped feature structure, e.g., the structure of FIG. 28. It is contemplated that the structures of FIGS. 28 and 29 may be suited for use in conjunction with a select device, such as the select device 550. For example, the select device 550 may include an ovonic threshold switch (OTS). Materials of the select device 550 may be formed as part of an initial precursor structure, e.g., the precursor structure 100 (FIG. 1), and the materials therein patterned in conjunction with the upper section 116 (FIG. 29) of the precursor structure 100 (FIG. 1). Thus, the resulting select device 550 may have the feature length $L_u$ matching that of the upper discrete features, as illustrated in FIG. 33. A fill material 552 may fill space between neighboring select devices 550.

Also disclosed is a magnetic memory cell structure comprising an elongate feature section comprising a region of magnetic material exhibiting a fixed vertical magnetic orientation. A discrete feature section over the elongate feature section comprises another region of magnetic material exhibiting a switchable vertical magnetic orientation. Another material is disposed between the region of magnetic material and the another region of magnetic material.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a magnetic memory cell, the method comprising:
   forming a precursor structure on a base, the precursor structure comprising a lower section comprising a magnetic material, an upper section comprising another magnetic material, and a non-magnetic material between the lower section and the upper section;
   patterning the upper section using an ion beam directed parallel to an x-axis to form an upper elongate feature section defining an upper feature width;
   forming a spacer on the upper elongate feature section to define a broader feature pattern;
   transferring the broader feature pattern to the non-magnetic material and the lower section to form a lower elongate feature section;
   patterning the upper elongate feature section using an ion beam directed parallel to a y-axis about perpendicular to the x-axis to form an upper discrete feature section;
   forming another spacer on the upper discrete feature section to define another broader feature pattern; and
   transferring the another broader feature pattern to the lower elongate feature section to form a lower discrete feature section.

2. The method of claim 1, further comprising forming a conductive material on the upper discrete feature section.

3. The method of claim 1, wherein forming a precursor structure on a base comprises forming the precursor structure on a base comprising a conductive material.

4. The method of claim 1, wherein patterning the upper elongate feature section comprises patterning the upper elongate feature section to form an upper discrete feature section comprising a free region of the magnetic memory cell.

5. The method of claim 4, wherein transferring the another broader feature pattern to the lower elongate feature section comprises transferring the another broader feature pattern to the lower elongate feature section to form a lower discrete feature section comprising a fixed region of the magnetic memory cell.

6. A method of forming a magnetic memory cell, the method comprising:
   patterning a precursor structure parallel to only an x-axis, the precursor structure comprising a lower section comprising a magnetic material, an upper section comprising another magnetic material, and a non-magnetic material between the lower section and the upper section, comprising directing an ion beam parallel to the x-axis to form an elongate stepped feature structure comprising a lower elongate feature section formed from the lower section and defining a lower feature width and comprising an upper elongate feature section formed from the upper section and defining an upper feature width less than the lower feature width; and
   after patterning the precursor structure parallel to only the x-axis, patterning the elongate stepped feature structure parallel to only a y-axis about perpendicular to the x-axis comprising directing an ion beam parallel to the y-axis to form an at least partially discrete stepped feature structure comprising an upper discrete feature section formed from the upper section.

7. The method of claim 6, wherein directing an ion beam parallel to the x-axis to form an elongate stepped feature structure comprises ion milling the upper section of the precursor structure parallel to the x-axis to form the upper elongate feature section.

8. The method of claim 7, wherein directing an ion beam parallel to the x-axis to form an elongate stepped feature structure further comprises ion milling the non-magnetic material and the lower section of the precursor structure parallel to the x-axis to form the lower elongate feature section.

9. The method of claim 8, wherein directing an ion beam parallel to the y-axis to form an at least partially discrete stepped feature structure comprises ion milling the upper elongate feature section parallel to the y-axis without ion milling through the non-magnetic material.

10. The method of claim 9, wherein directing an ion beam parallel to the y-axis to form an at least partially discrete stepped feature structure further comprises ion milling the non-magnetic material and the lower elongate feature section parallel to the y-axis to form a discrete stepped feature structure comprising the upper discrete feature section and a lower discrete feature section, the upper discrete feature section having the upper feature width, and the lower discrete feature section having the lower feature width.

11. The method of claim 6, wherein directing an ion beam parallel to the x-axis to form an elongate stepped feature structure comprises:
   ion milling the upper section, the non-magnetic material, and the lower section of the precursor structure parallel to the x-axis to form an elongate precursor feature defining the lower feature width; and
   ion milling an upper portion of the elongate precursor feature parallel to the x-axis to form the elongate stepped feature structure comprising the lower elongate feature section and the upper elongate feature section.

12. The method of claim 11, wherein directing an ion beam parallel to the y-axis to form an at least partially discrete stepped feature structure comprises:
   ion milling the elongate stepped feature structure to a base material to form a discrete precursor feature defining a lower feature length; and
   ion milling an upper portion of the discrete precursor feature to the non-magnetic material to form the at least partially discrete stepped feature structure comprising the upper discrete feature section and a lower discrete feature section, the upper discrete feature section having the upper feature width and an upper feature length, the lower discrete feature section having the lower feature width and the lower feature length.

13. A method of forming a magnetic memory cell, the method comprising:
   patterning, parallel to only one axis using an ion beam directed parallel to the only one axis, a mask material to form an elongate mask feature parallel to the only one axis;
   patterning the elongate mask feature parallel to another axis perpendicular to the only one axis using an ion beam directed parallel to the another axis to define a discrete mask pattern defining an upper feature width and an upper feature length;
   transferring the discrete mask pattern to a magnetic material disposed on a non-magnetic material disposed on another magnetic material to form an upper discrete feature having the upper feature width and the upper feature length;
   forming spacers on sidewalls of the upper discrete feature to define a broader discrete feature pattern defining a lower feature width and a lower feature length; and
   transferring the broader discrete feature pattern to the non-magnetic material and the another magnetic material to form a lower discrete feature having the lower feature width and the lower feature length, the upper discrete feature disposed on the lower discrete feature.

14. The method of claim 13, wherein forming spacers on sidewalls of the upper discrete feature comprises forming silicon nitride on sidewalk of the upper discrete feature.

15. A method of forming a magnetic memory cell, the method comprising:
   directing an ion beam parallel to an x-axis to selectively remove at least one portion of a magnetic material from an upper section of a precursor structure to form an upper elongate feature section comprising a remaining portion of the magnetic material supported on a non-magnetic material separating the magnetic material from another magnetic material on a base material, the upper elongate feature section defining an upper feature width;
   directing the ion beam parallel to the x-axis to selectively remove at least one portion of the non-magnetic material and at least one portion of the another magnetic material to form a lower elongate feature section between the upper elongate feature section and the base material, the lower elongate feature section comprising a remaining portion of the non-magnetic material and a remaining portion of the another magnetic material;
   directing the ion beam parallel to a y-axis about perpendicular to the x-axis to selectively remove at least one other portion of the magnetic material from the upper elongate feature section to form an upper discrete feature section comprising another remaining portion of the magnetic material supported on the remaining portion of the non-magnetic material separating the another remaining portion of the magnetic material from the remaining portion of the another magnetic material on the base material; and
   directing the ion beam parallel to the y-axis to selectively remove at least one other portion of the non-magnetic material and at least one other portion of the another magnetic material from the lower elongate feature section to form a lower discrete feature section comprising another remaining portion of the non-magnetic material and another remaining portion of the another magnetic material.

* * * * *